(12) United States Patent
Chen

(10) Patent No.: US 11,894,385 B2
(45) Date of Patent: Feb. 6, 2024

(54) ELECTRONIC DEVICE

(71) Applicants: HannStar Display (Nanjing) Corporation, Nanjing (CN); HANNSTAR DISPLAY CORPORATION, Taipei (TW)

(72) Inventor: Yen-Chung Chen, Taichung (TW)

(73) Assignees: HannStar Display (Nanjing) Corporation, Nanjing (CN); HANNSTAR DISPLAY CORPORATION, Taipei (TW)

( * ) Notice: Subject to any disclaimer, the term of this patent is extended or adjusted under 35 U.S.C. 154(b) by 0 days.

(21) Appl. No.: 17/876,593

(22) Filed: Jul. 29, 2022

(65) Prior Publication Data

US 2022/0367527 A1 Nov. 17, 2022

Related U.S. Application Data

(63) Continuation of application No. 16/822,047, filed on Mar. 18, 2020, now abandoned.

(30) Foreign Application Priority Data

Apr. 2, 2019 (CN) .......................... 201910262389.X

(51) Int. Cl.
*H01L 27/12* (2006.01)
*H01L 23/552* (2006.01)

(52) U.S. Cl.
CPC ........ *H01L 27/1218* (2013.01); *H01L 23/552* (2013.01); *H01L 27/124* (2013.01)

(58) Field of Classification Search
CPC .. H01L 27/1218; H01L 23/552; H01L 27/124

USPC .......................................................... 257/659
See application file for complete search history.

(56) References Cited

U.S. PATENT DOCUMENTS

| | | | |
|---|---|---|---|
| 9,860,976 B1 | 1/2018 | Wang | |
| 2012/0156402 A1 | 6/2012 | Domanski | |
| 2014/0042406 A1 | 2/2014 | Degner | |
| 2017/0062773 A1 | 3/2017 | Lee | |
| 2018/0014399 A1 | 1/2018 | Chung | |
| 2019/0305073 A1 | 10/2019 | Chen | |

FOREIGN PATENT DOCUMENTS

| | | |
|---|---|---|
| CN | 102765552 A | 11/2012 |
| CN | 103972264 A | 8/2014 |
| CN | 204405995 U | 6/2015 |

(Continued)

*Primary Examiner* — Ori Nadav
(74) *Attorney, Agent, or Firm* — Winston Hsu

(57) ABSTRACT

An electronic device includes a flexible substrate and a driving component. In the flexible substrate, a first side region, a second side region and a first cutting structure are disposed in a peripheral region, wherein a display region and the first side region are separated by a first edge of the display region, the display region and the second side region are separated by a second edge of the display region, the first edge and the second edge are respectively parallel to a first direction and a second direction perpendicular to the first direction, the first cutting structure has a first endpoint and two edges separated by the first endpoint and respectively belonging to the first side region and the second side region. The driving component overlaps the flexible substrate in a top view direction perpendicular to the first direction and the second direction.

20 Claims, 13 Drawing Sheets

(56) References Cited

FOREIGN PATENT DOCUMENTS

| | | | |
|---|---|---|---|
| CN | 104965330 | A | 10/2015 |
| CN | 105448204 | A | 3/2016 |
| CN | 106894595 | A | 6/2017 |
| CN | 107584248 | A | 1/2018 |
| CN | 108389876 | A | 8/2018 |
| CN | 109192078 | A | 1/2019 |
| CN | 109240013 | A | 1/2019 |
| CN | 109285454 | A | 1/2019 |
| CN | 109449194 | A | 3/2019 |
| JP | 2019-15937 | A | 1/2019 |
| TW | 201325993 | A1 | 7/2013 |
| WO | 2008/123416 | A1 | 10/2008 |

ELECTRONIC DEVICE

CROSS REFERENCE TO RELATED APPLICATIONS

This application is a continuation application of U.S. application Ser. No. 16/822,047, filed on Mar. 18, 2020. The content of the application is incorporated herein by reference.

BACKGROUND OF THE INVENTION

1. Field of the Invention

The present invention relates to an electronic device, and more particularly to an electronic device having a bending part in a peripheral region.

2. Description of the Prior Art

Nowadays, electronic devices have become an indispensable item in society. For example, since the electronic device such as a display device or a touch display device has the characteristics of thin appearance, light weight, low power consumption and no radiation pollution, it has been widely used in many kinds of electronic products, such as notebooks, smart phones, watches, and display devices in vehicles, for transmitting and displaying information more conveniently. In order to make the size of the electronic device smaller for meeting requirements and expectations of the users, border of the electronic device (such as the region of the display device which the peripheral circuit and/or peripheral chip is disposed in) may be reduced. However, the reliability of such electronic device manufactured by the conventional techniques is low (for example, the trace of the electronic device may be broken to be an open circuit), or the degree of reducing the border by the conventional techniques is insufficient.

SUMMARY OF THE INVENTION

The present invention provides an electronic device, wherein a peripheral region of a flexible substrate has a bending part and a cutting structure adjacent to the bending part, such that the peripheral region of the flexible substrate can be bent to reduce the border and downsized the electronic device under the condition that the reliability of the electronic device is not affected.

An embodiment of the present invention provides an electronic device having a display region and a peripheral region situated outside of the display region. The electronic device includes a flexible substrate and a driving component. The flexible substrate includes a first side region, a second side region, a first bending part, a second bending part and a first cutting structure. The first side region is disposed in the peripheral region, wherein the display region and the first side region are separated by a first edge of the display region, the first edge is parallel to a first direction, and a length direction of the first side region is parallel to the first direction. The second side region is disposed in the peripheral region, wherein the display region and the second side region are separated by a second edge of the display region, and the second edge is parallel to a second direction, a length direction of the second side region is parallel to the second direction, and the second direction is perpendicular to the first direction. The first bending part is included in the first side region in the peripheral region, wherein the first bending part is configured to be bent. The second bending part is included in the second side region in the peripheral region, wherein the second bending part is configured to be bent. The first cutting structure is disposed in the peripheral region, wherein the first cutting structure has a first endpoint, the first cutting structure includes two edges separated by the first endpoint, one of the two edges of the first cutting structure belongs to the first bending part, and another one of the two edges of the first cutting structure belongs to the second bending part. The driving component is disposed on the flexible substrate and disposed in the peripheral region. The driving component overlaps the flexible substrate in a top view direction when the flexible substrate is not bent, and the top view direction is perpendicular to the first direction and the second direction.

An embodiment of the present invention provides an electronic device having a display region and a peripheral region situated outside of the display region. The electronic device includes a flexible substrate and a driving component. The flexible substrate includes a first side region, a second side region and a first cutting structure. The first side region is disposed in the peripheral region, wherein the display region and the first side region are separated by a first edge of the display region, the first edge is parallel to a first direction, and a length direction of the first side region is parallel to the first direction. The second side region is disposed in the peripheral region, wherein the display region and the second side region are separated by a second edge of the display region, and the second edge is parallel to a second direction, a length direction of the second side region is parallel to the second direction, and the second direction is perpendicular to the first direction. The first cutting structure is disposed in the peripheral region, wherein the first cutting structure has a first endpoint, the first cutting structure includes two edges separated by the first endpoint, one of the two edges of the first cutting structure belongs to the first side region, and another one of the two edges of the first cutting structure belongs to the second side region. The driving component is disposed on the flexible substrate and disposed in the peripheral region. The driving component overlaps the flexible substrate in a top view direction when the flexible substrate is not bent, and the top view direction is perpendicular to the first direction and the second direction.

The peripheral region of the present invention is bent backward to the back of the active region to reduce the border and size of the electronic device by bending ways. Furthermore, the flexible substrate has the cutting structures in the peripheral region which can determine the extending lines and separate the bending parts, when the bending ways are proceeded on the peripheral region, at least one of the bending parts of the peripheral region may be bent according to the corresponding extending line, such that the main bending portions having the peripheral traces and/or the electronic components are only bent one time, so as to enhance the yield of the peripheral traces and further improve qualities of the electronic device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
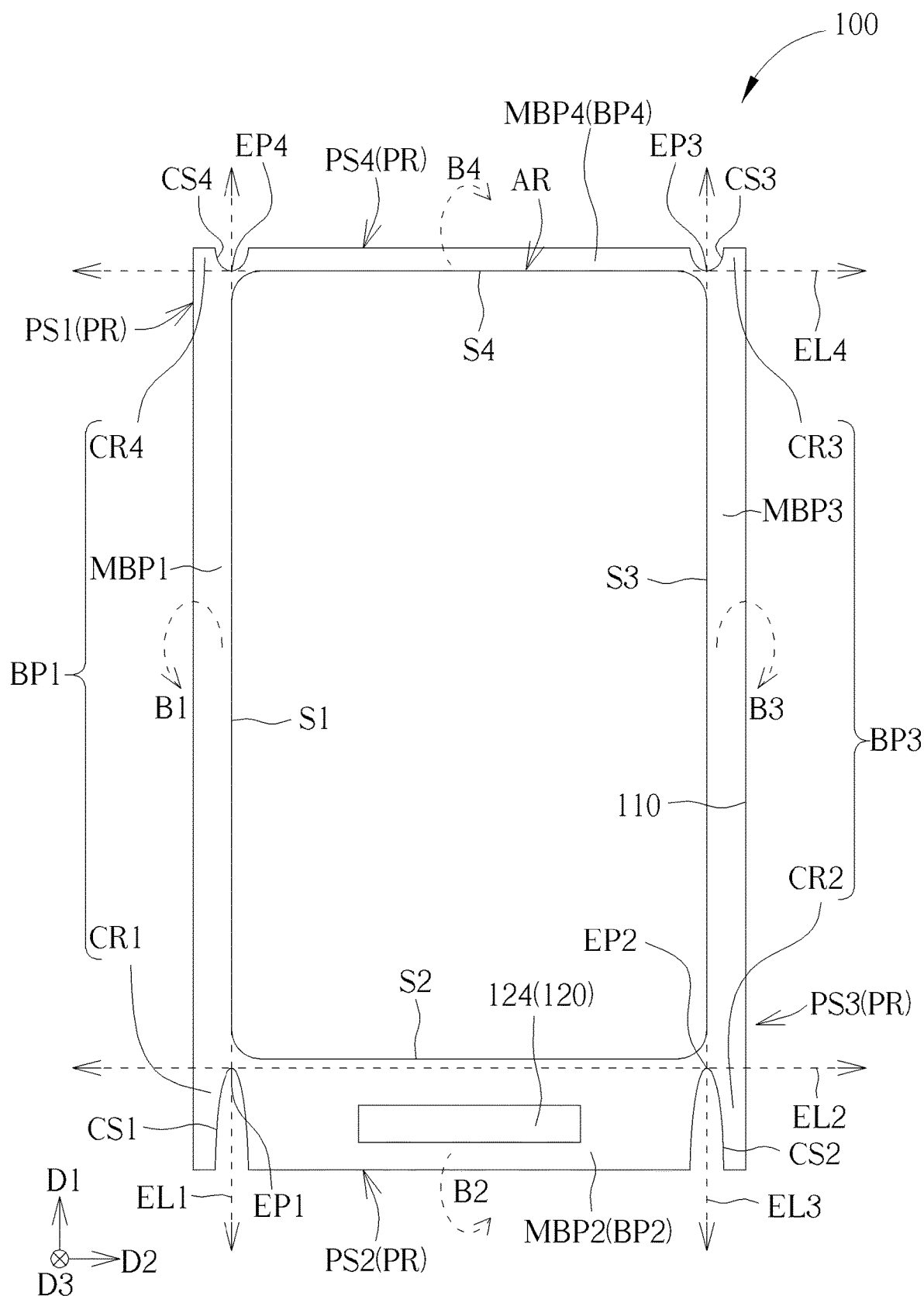
FIG. 1 is a schematic diagram showing a top view of an electronic device which is not bent according to a first embodiment of the present invention.

To provide a better understanding of the present invention to those skilled in the art, some embodiments will be detailed in the following description. The embodiments of the present invention are illustrated in the accompanying drawings with numbered elements to elaborate on the contents and effects to be achieved. It should be noted that the drawings are simplified schematics, and therefore show only the components and combinations associated with the present invention, so as to provide a clearer description for the basic structure or implementing method of the present invention. The components would be more complex in reality. In addition, for ease of explanation, the components shown in the drawings may not represent their actual number, shape, and dimensions; details may be adjusted according to design requirements.

Note that the terms "back", "rear", "backward" and "behind" described herein refer to the relative relationship in a top view direction. For instance, if one structure is situated at the rear of one film, the film is upper than the structure in the top view direction.

Figure 2:
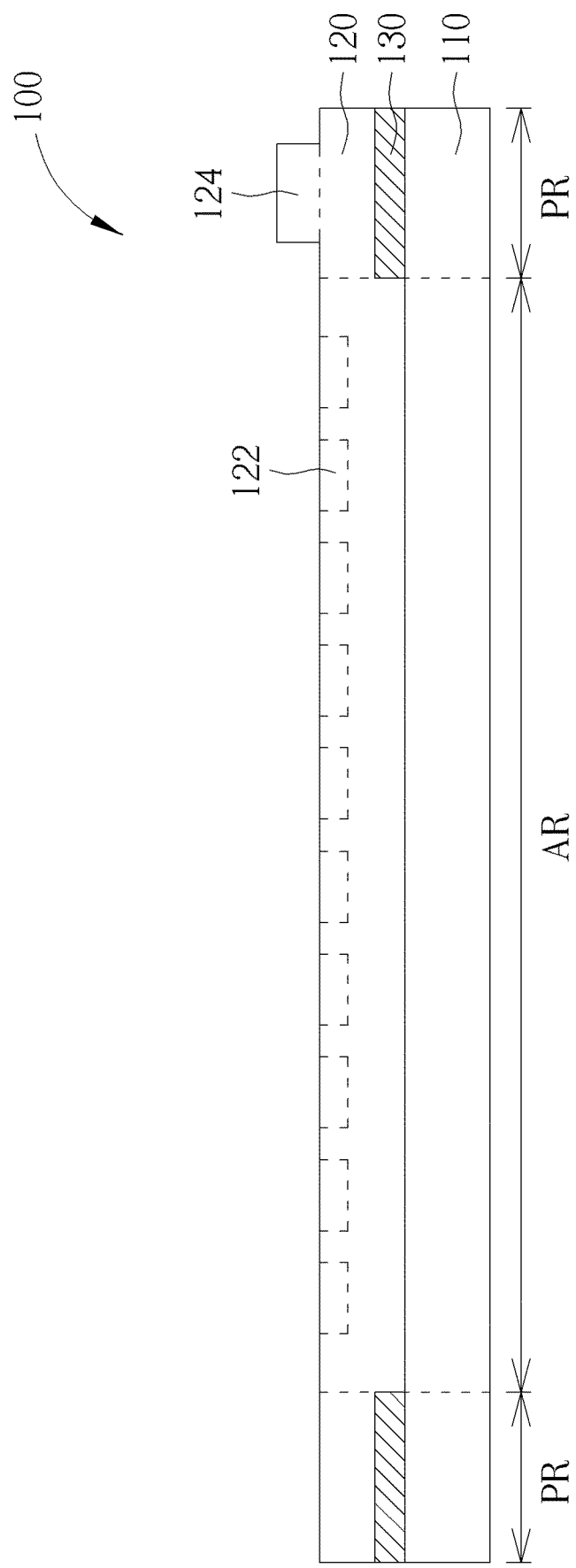
FIG. 2 is a schematic diagram showing a cross-sectional view of the electronic device which is not bent according to the first embodiment of the present invention.
Figure 3:
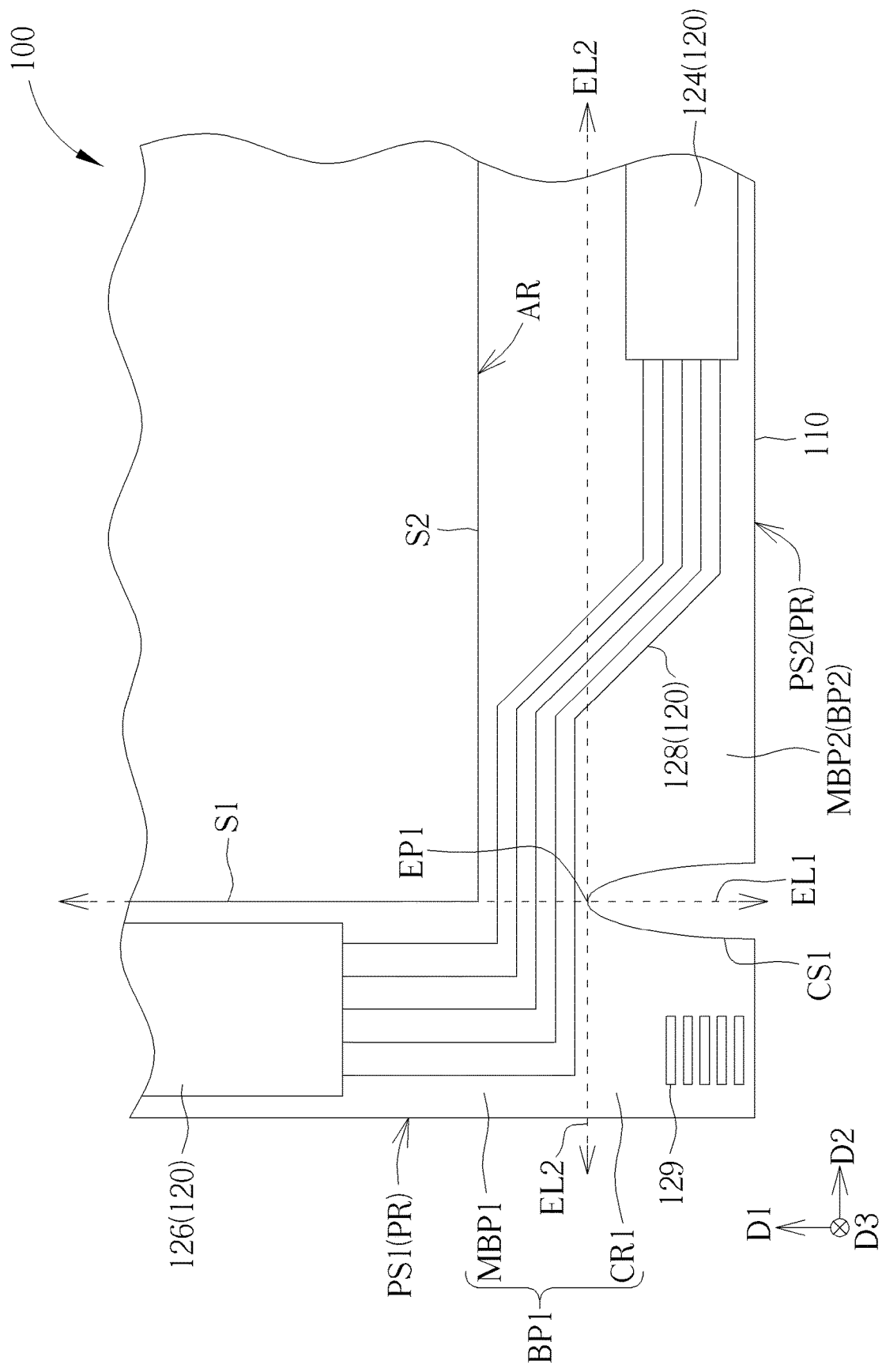
FIG. 3 is an enlarged diagram of a corner in FIG. 1.

Referring to FIG. 1 to FIG. 3, FIG. 1 is a schematic diagram showing a top view of an electronic device which is not bent according to a first embodiment of the present invention, FIG. 2 is a schematic diagram showing a cross-sectional view of the electronic device which is not bent according to the first embodiment of the present invention, and FIG. 3 is an enlarged diagram of a corner in FIG. 1. Note that the electronic device 100 may be such as a flexible display device (e.g. a liquid crystal display (LCD), a micro light emitting diode display (micro LED display), an active-matrix organic light emitting diode display (AMOLED display) and so on), a flexible touch pad, a flexible touch display device or any other suitable flexible electronic device, but the present invention is not limited thereto. In some cases, the electronic device 100 may be an inflexible electronic device. As shown in FIG. 1 to FIG. 3, the electronic device 100 includes a flexible substrate 110 and an electronic component layer 120. The flexible substrate 110 is configured to be served as a substrate of the electronic device 100, and has an active region AR and a peripheral region PR situated outside of the active region AR. For instance, if the electronic device 100 is a display device, the active region AR may be served as a display region for displaying images, and components, structures and films configured to assist the display region in displaying images may be situated in the peripheral region PR. In this embodiment, the peripheral region PR surrounds the active region AR. For example, the peripheral region PR may include a first side region PS1, a second side region PS2 which is adjacent to the first side region PS1, a third side region PS3 which is adjacent to the second side region PS2 and a fourth side region PS4 which is adjacent to the first side region PS1 and the third side region PS3, and the side regions PS1-PS4 are combined to surround the active region AR, but not limited thereto. Then, the active region AR may have a first edge S1 facing the first side region PS1, a second edge S2 facing the second side region PS2, a third edge S3 facing the third side region PS3 and a fourth edge S4 facing the fourth side region PS4, but not limited thereto. Note that, in the peripheral region PR, the first side region PS1, the second side region PS2, the third side region PS3 and the fourth side region PS4 are respectively disposed on a side of different edges of the active region AR. For instance, the first side region PS1 is a region on the left side of the first edge S1 of the active region AR (i.e. a region of the peripheral region PR on the left side of the active region AR in FIG. 1), the second side region PS2 is a region on the lower side of the second edge S2 of the active region AR (i.e. a region of the peripheral region PR on the lower side of the active region AR in FIG. 1), the third side region PS3 is a region on the right side of the third edge S3 of the active region AR (i.e. a region of the peripheral region PR on the right side of the active region AR in FIG. 1), and the fourth side region PS4 is a region on the upper side of the fourth edge S4 of the active region AR (i.e. a region of the peripheral region PR on the upper side of the active region AR in FIG. 1). Moreover, the electronic device 100 and the active region AR may be any other suitable shape. For example, the electronic device 100 of this embodiment is rectangular, such that the first side region PS1 and the third side region PS3 extend along a first direction D1, the second side region PS2 and the fourth side region PS4 extend along a second direction D2, the first edge S1 and the third edge S3 are parallel to the first direction D1, and the second edge S2 and the fourth edge S4 are parallel to the second direction D2. In this embodiment, the first direction D1 is not parallel to the second direction D2 (e.g. the first direction D1 is perpendicular to the second direction D2), but not limited thereto. In addition, the flexible substrate 110 may include such as polyimide (PI), polyethylene terephthalate (PET) or any other suitable flexible material.

The electronic component layer 120 is disposed on the flexible substrate 110, and includes a plurality of electronic components 122. The electronic components 122 may include active components, passive components or any other suitable electronic components. The electronic components 122 may be correspondingly altered based on the type of the electronic device 100, such that the electronic device 100 may have a function of displaying images, a function of touch sensing and/or any other suitable function. For instance, if the electronic device 100 is a display device, the electronic component layer 120 in the active region AR may include the active components such as thin film transistors and light emitting components (e.g. light emitting diodes, organic light emitting diode) and the passive components such as capacitors or resistors, and the electronic component layer 120 in the peripheral region PR may include the peripheral traces, driving component(s) (such as a gate driving circuit, a source driving circuit and/or an integrated circuit (IC)) and/or any other suitable components. The driving component may be electrically connected to the active component in the active region AR or another driving component through the peripheral trace. Note that, in FIG. 1 to FIG. 3, the range of the active region AR is only shown in FIG. 1, one driving component 124 is exemplarily shown in the peripheral region PR of FIG. 1 to serve as one of the electronic components of the peripheral region PR (in FIG. 1, the driving component 124 is disposed in the second side region PS2 for example), the electronic components 122 of the electronic component layer 120 in FIG. 2 exemplarily show the active components in the active region AR and one driving component 124 in the peripheral region PR, and FIG. 3 enlarges the lower-left corner shown in FIG. 1 and shows the peripheral traces 128 and the driving components 124, 126 of the electronic component layer 120, so as to make the figures clear. The driving components 124 may be an integrated circuit for example, and the driving components 126 may be a gate driving circuit for example. The number of the driving components 124 and the number of the driving components 126 are not limited by FIG. 1 and FIG. 2. In addition, the electronic device 100 may optionally include any other required structure(s) and/or any other required film(s), such as a color filter layer, a light shielding layer, an alignment layer, a common electrode layer, a pixel electrode layer, a display medium layer, a polarizer and/or an opposite substrate. For instance, the electronic device 100 may further include a peripheral light shielding layer 130 disposed in the peripheral region PR and configured to shield the peripheral region PR for determining the range of the active region AR. In this embodiment, the active region AR may be surrounded by the peripheral light shielding layer 130 according to a top view direction D3, and the peripheral light shielding layer 130 may be disposed on the flexible substrate 110, but not limited thereto. In another embodiment, the peripheral light shielding layer 130 may be disposed on the opposite substrate opposite to the flexible substrate 110. Moreover, in another embodiment, since the almost entire peripheral region PR may be bent backward to the back of the active region AR (that is, the electronic component layer 120 disposed in the peripheral region PR may be situated at the back of the active region AR almost after being bent), there is no need to deploy a peripheral light shielding layer, so as to advantage the manufacturing process and the cost.

In the peripheral region PR, the flexible substrate 110 may have at least one cutting structure and at least two bending parts. Each cutting structure is situated between two bending parts, so as to separate two bending parts from each other and determine the region of the adjacent bending parts. The bending part is configured to be bent towards the backside of the active region AR. In this embodiment, the flexible substrate 110 may have a first bending part BP1 and a second bending part BP2 in the peripheral region PR, and may optionally have a third bending part BP3 and a fourth bending part BP4 in the peripheral region PR. The first bending part BP1 may be disposed in the first side region PS1, the second bending part BP2 may be disposed in the second side region PS2, the third bending part BP3 may be disposed in the third side region PS3, the fourth bending part BP4 may be disposed in the fourth side region PS4, the first bending part BP1 and the third bending part BP3 may extend along the first direction D1, and the second bending part BP2 and the fourth bending part BP4 may extend along the second direction D2, but not limited thereto. The electronic device 100 having different shapes may have the bending parts of corresponding designs. Furthermore, the flexible substrate 110 has the first cutting structure CS1 in the peripheral region PR, and the first cutting structure CS1 is adjacent to the first bending part BP1 and the second bending part BP2. That is to say, the first bending part BP1 and the second bending part BP2 is divided by the first cutting structure CS1. For example, the second bending part BP2 shown in FIG. 1 is adjacent to the first cutting structure CS1 in the second direction D2; that is to say, an end of the second bending part BP2 in the second direction D2 is separated from the first bending part BP1 by the first cutting structure CS1, but not limited thereto. The flexible substrate 110 may optionally have a second cutting structure CS2, a third cutting structure CS3 and a fourth cutting structure CS4 in the peripheral region PR, wherein the second cutting structure CS2 is adjacent to the second bending part BP2 and the third bending part BP3, the third cutting structure CS3 is adjacent to the third bending part BP3 and the fourth bending part BP4, and the fourth cutting structure CS4 is adjacent to the fourth bending part BP4 and the first bending part BP1. For instance, in FIG. 1, the second bending part BP2 is situated between the first cutting structure CS1 and the second cutting structure CS2 in the second direction D2, the fourth bending part BP4 is situated between the third cutting structure CS3 and the fourth cutting structure CS4 in the second direction D2, the first cutting structure CS1 corresponds to the fourth cutting structure CS4 in the first direction D1, and the second cutting structure CS2 corresponds to the third cutting structure CS3 in the first direction D1, but not limited thereto. The positions of the bending parts may be designed based on the shape and/or the bending requirement of the electronic device 100. In addition, a top view shape of the cutting structure may be for example a sector, a triangle, a rectangle, a polygon, a shape having a curved edge (the curved edge may be for example a U-shaped edge, an elliptical arc, and a circular arc and so on) or any other suitable shape; or, the cutting structure may include a cutting line including a straight line and/or a curved line. In this embodiment, each of the top view shapes of the first cutting structure CS1, the second cutting structure CS2, the third cutting structure CS3 and the fourth cutting structure CS4 has the U-shaped edge, and the first cutting structure CS1, the second cutting structure CS2, the third cutting structure CS3 and the fourth cutting structure CS4 respectively have a first endpoint EP1, a second endpoint EP2, a third endpoint EP3 and a fourth endpoint EP4 at their deepest position (as shown in FIG. 1), but not limited thereto. In another embodiment, the top view shapes of the cutting structures may be the same or different. When manufacturing the cutting structure, for example, the process may cut from the edge of the flexible substrate 110 to the endpoint of the cutting structure substantially along the first direction D1, but not limited thereto. In another embodiment, the cutting structure may be formed by cutting substantially along the second direction D2 or any other suitable direction.

Note that, before bending the bending parts, a straight line passing through the first endpoint EP1 and the fourth endpoint EP4 is defined as a first extending line EL1, a straight line passing through the first endpoint EP1 and the second endpoint EP2 is defined as a second extending line EL2, a straight line passing through the second endpoint EP2 and the third endpoint EP3 is defined as a third extending line EL3, and a straight line passing through the third endpoint EP3 and the fourth endpoint EP4 is defined as a fourth extending line EL4, wherein each extending lines EL1-EL4 is a virtual line. In this embodiment, the first extending line EL1 and the third extending line EL3 are parallel to the first direction D1, and the second extending line EL2 and the fourth extending line EL4 are parallel to the second direction D2, but not limited thereto. Note that, in FIG. 1, the first bending part BP1 is a portion of the flexible substrate 110 situated on the left side of the first extending line EL1, the second bending part BP2 is a portion of the flexible substrate 110 situated on the lower side of the second extending line EL2 and between the first cutting structure CS1 and the second cutting structure CS2, the third bending part BP3 is a portion of the flexible substrate 110 situated on the right side of the third extending line EL3, and the fourth bending part BP4 is a portion of the flexible substrate 110 situated on the upper side of the fourth extending line EL4 and between the third cutting structure CS3 and the fourth cutting structure CS4, but the present invention is not limited thereto.

Moreover, in this embodiment, the first endpoint EP1 and the fourth endpoint EP4 may be aligned with the first edge S1 of the active region AR in the first direction D1, the second endpoint EP2 and the third endpoint EP3 may be aligned with the third edge S3 of the active region AR in the first direction D1, and the third endpoint EP3 and the fourth endpoint EP4 may be aligned with the fourth edge S4 of the active region AR in the second direction D2. Therefore, the first extending line EL1 is aligned with the first edge S1, the third extending line EL3 is aligned with the third edge S3, and the fourth extending line EL4 is aligned with the fourth edge S4. That is to say, the first bending part BP1, the third bending part BP3 and the fourth bending part BP4 are directly adjacent to the active region AR. On the other hand, since the first endpoint EP1 and the second endpoint EP2 are not aligned with the second edge S2 of the active region AR in the second direction D2, a distance exists between the second extending line EL2 and the second edge S2, such that a distance exists between the second bending part BP2 and the active region AR, but the present invention is not limited thereto. The disposing relation between the endpoint of the cutting structure and the edge of the active region AR may be designed based on requirements.

In addition, as shown in FIG. 3, to prevent the peripheral traces 128 from breaking by cutting processes while forming the cutting structure, a distance exists between the cutting structure and the active region AR, and the peripheral traces 128 are disposed in this distance. In other words, the peripheral traces 128 are disposed between the active region AR and the cutting structures. For example, the peripheral traces 128 are disposed between the active region AR and the first cutting structure CS1, so as to be electrically connected between two driving components 124, 126.

In this embodiment, a bending part may include a main bending portion and/or a corner portion, wherein the corner portion is situated at a corner of the flexible substrate 110. As an example, as shown in FIG. 1, the first bending part BP1 may include a first main bending portion MBP1, a first corner portion CR1 and a fourth corner portion CR4, the third bending part BP3 may include a third main bending portion MBP3, a second corner portion CR2 and a third corner portion CR3, the second bending part BP2 may include a second main bending portion MBP2, and the fourth bending part BP4 may include a fourth main bending portion MBP4, but not limited thereto. In one embodiment, each of the bending parts may only include the main bending portion. In another embodiment, each of the bending parts may include the main bending portion and one corner portion. As shown in FIG. 1, when the flexible substrate 110 is not bent, the main bending portion and the corner portion may be divided by the aforementioned extending lines. In detail, the first main bending portion MBP1 of the first bending part BP1 and the third main bending portion MBP3 of the third bending part BP3 are situated between the second extending line EL2 and the fourth extending line EL4, the first corner portion CR1 is situated on a side of the second extending line EL2 opposite to the first main bending portion MBP1, the second corner portion CR2 is situated on a side of the second extending line EL2 opposite to the third main bending portion MBP3, the third corner portion CR3 is situated on a side of the fourth extending line EL4 opposite to the third main bending portion MBP3, and the fourth corner portion CR4 is situated on a side of the fourth extending line EL4 opposite to the first main bending portion MBP1. Furthermore, the first cutting structure CS1 is disposed between the first corner portion CR1 of the first bending part BP1 and the second bending part BP2, the second cutting structure CS2 is disposed between the second corner portion CR2 of the third bending part BP3 and the second bending part BP2, the third cutting structure CS3 is disposed between the third corner portion CR3 of the third bending part BP3 and the fourth bending part BP4, and the fourth cutting structure CS4 is disposed between the fourth corner portion CR4 of the first bending part BP1 and the fourth bending part BP4. Metal conductive pattern(s) or metal conductive structure(s) (e.g. formed of the electronic component layer 120) disposed in the corner portion may be designed based on requirements. In some cases, the peripheral traces 128 are not disposed in the corner portion. In this embodiment, the corner portion may have a label or a mark configured to label the model number of the electronic device 100 or be an alignment mark (e.g. the mark 129 shown in FIG. 3), but not limited thereto. In another embodiment, the corner portion may neither have any metal conductive pattern nor metal conductive structure.

Figure 4A:
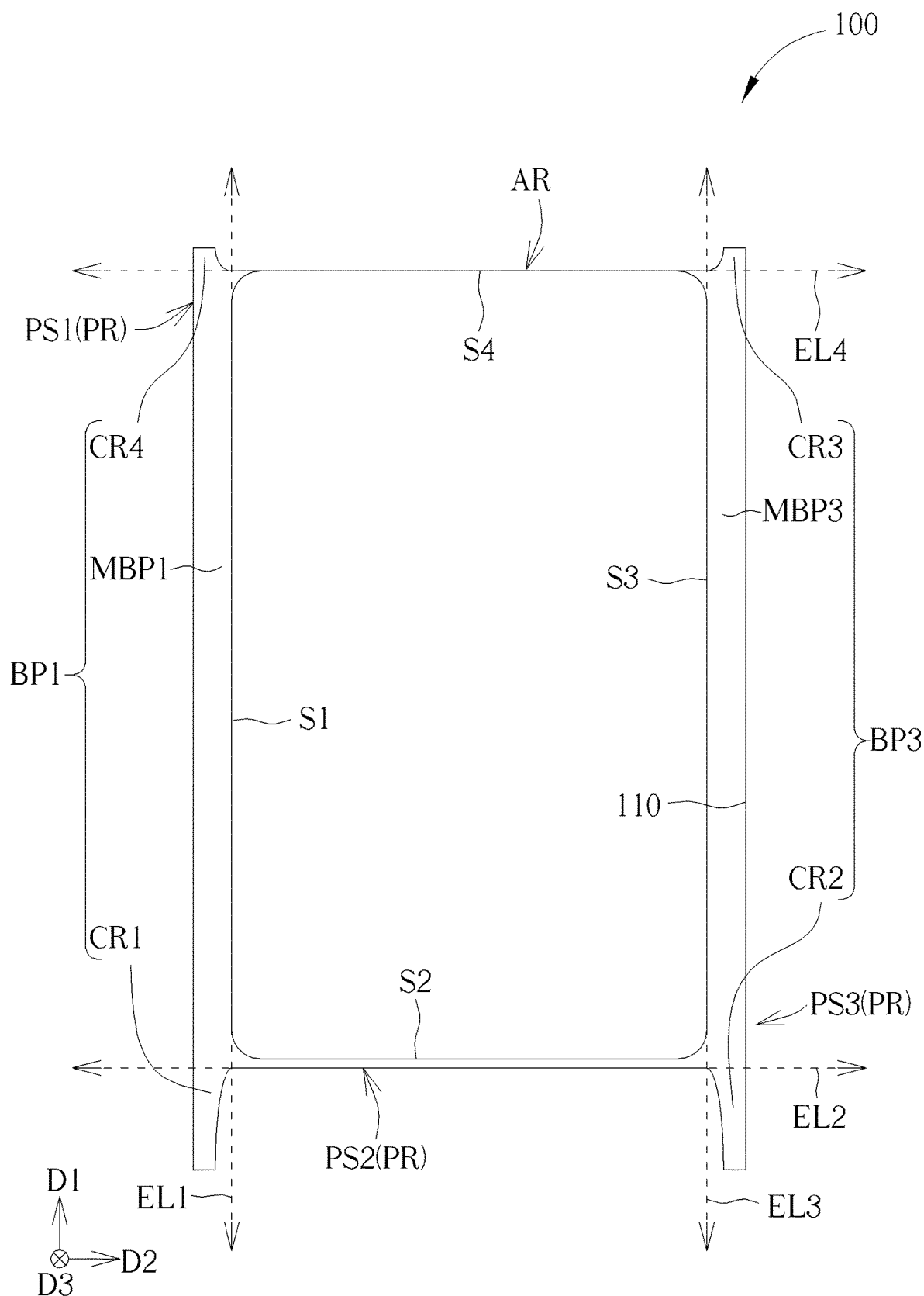
FIG. 4A, FIG. 4B and FIG. 4C are schematic diagrams respectively showing top views of a bending process of the electronic device according to the first embodiment of the present invention.
Figure 4B:
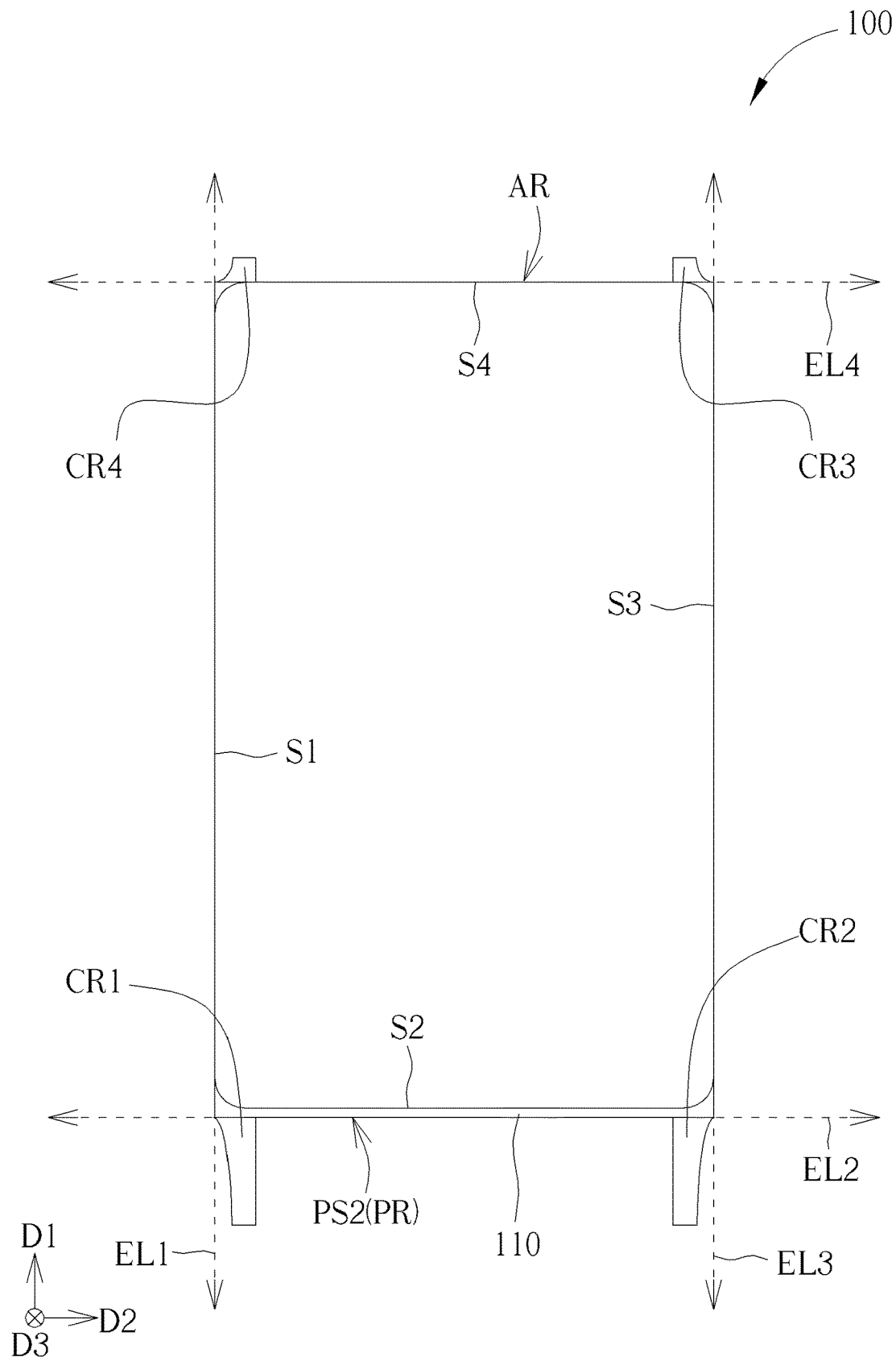
Figure 4C:
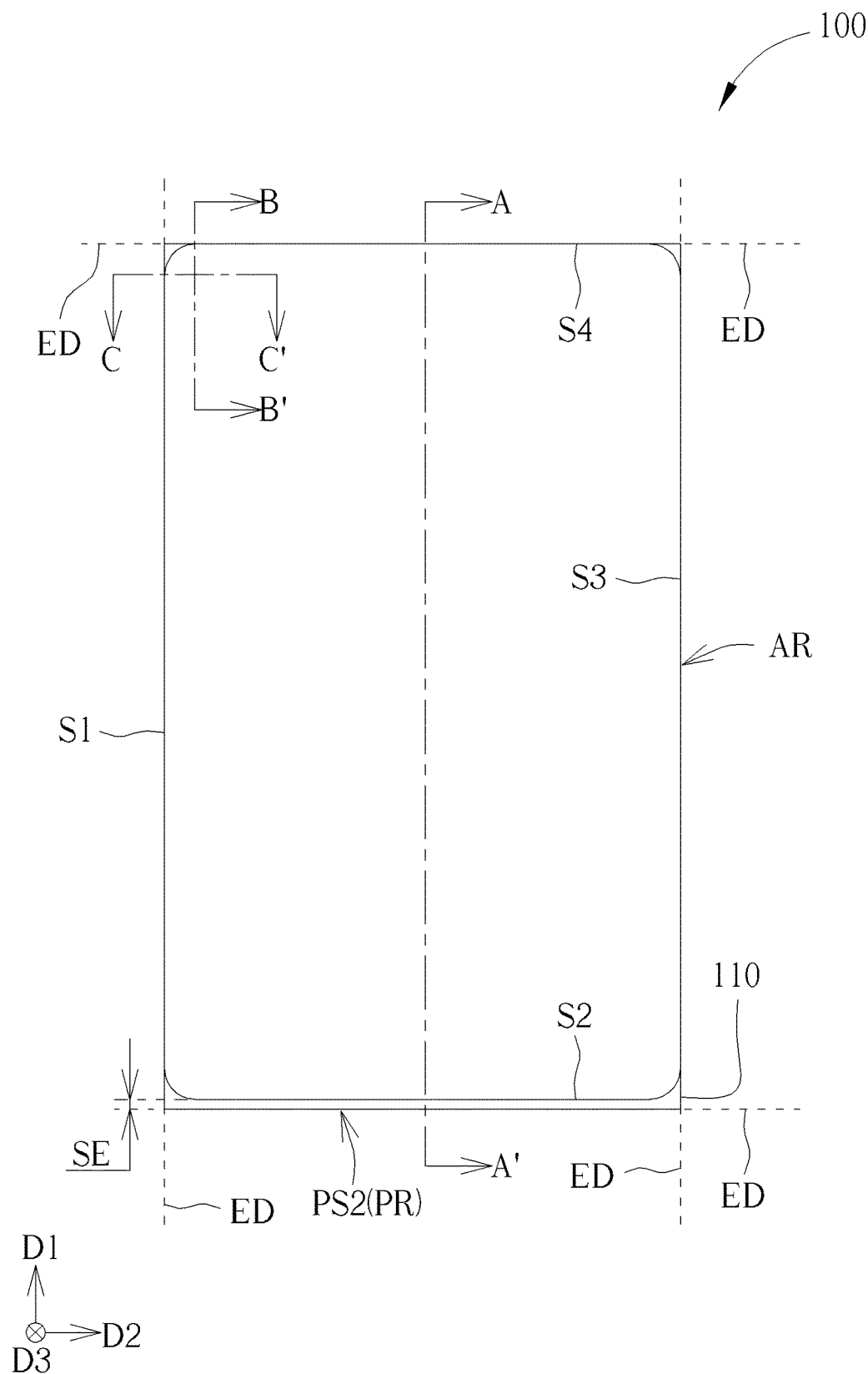
Figure 5:
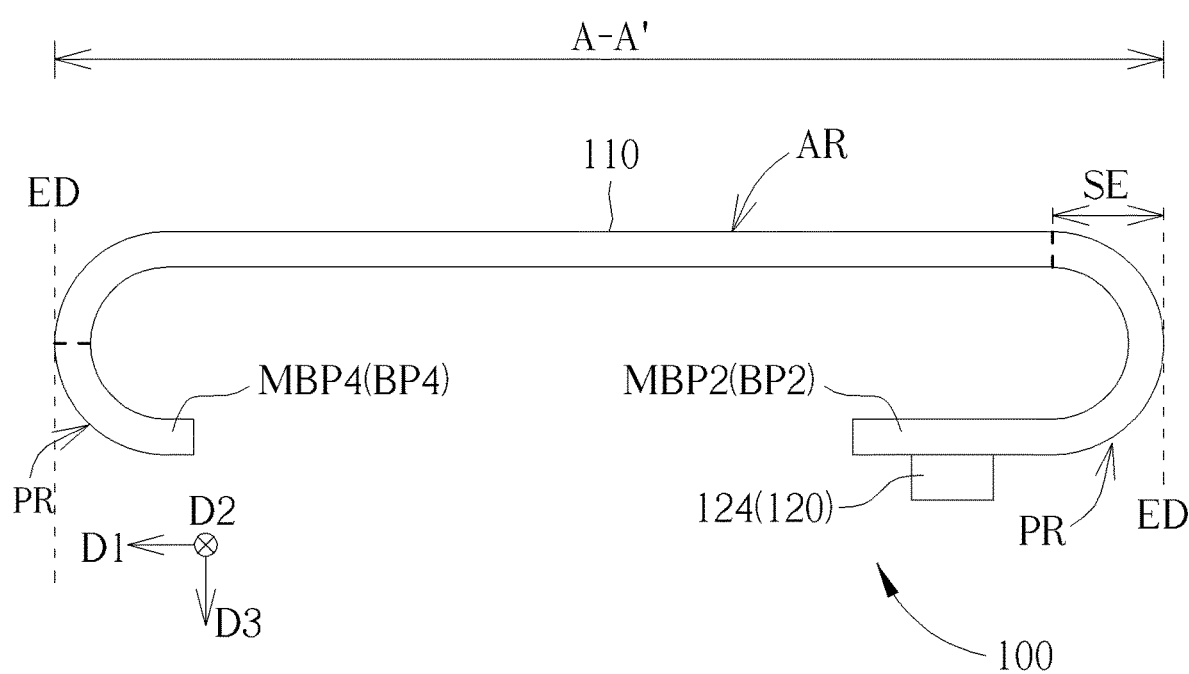
FIG. 5 is a schematic diagram showing a cross-sectional view taken along a cross-sectional line A-A' in FIG. 4C.
Figure 6A:
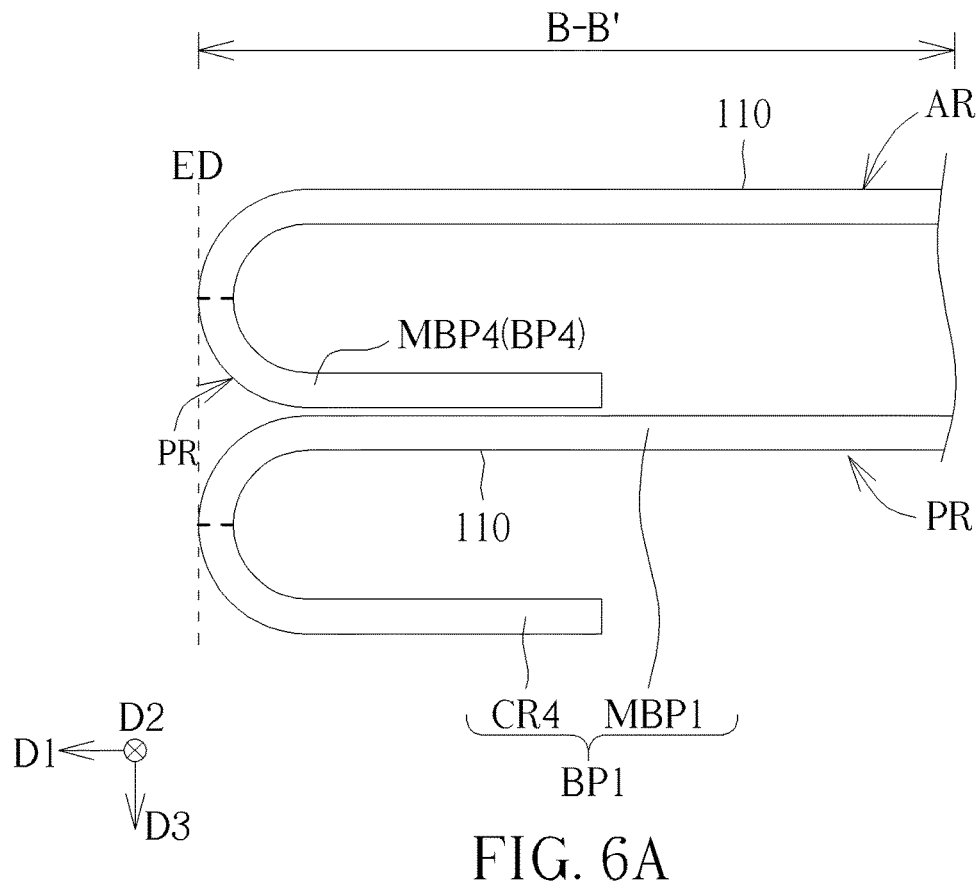
FIG. 6A is a schematic diagram showing a cross-sectional view taken along a cross-sectional line B-B' in FIG. 4C.
Figure 6B:
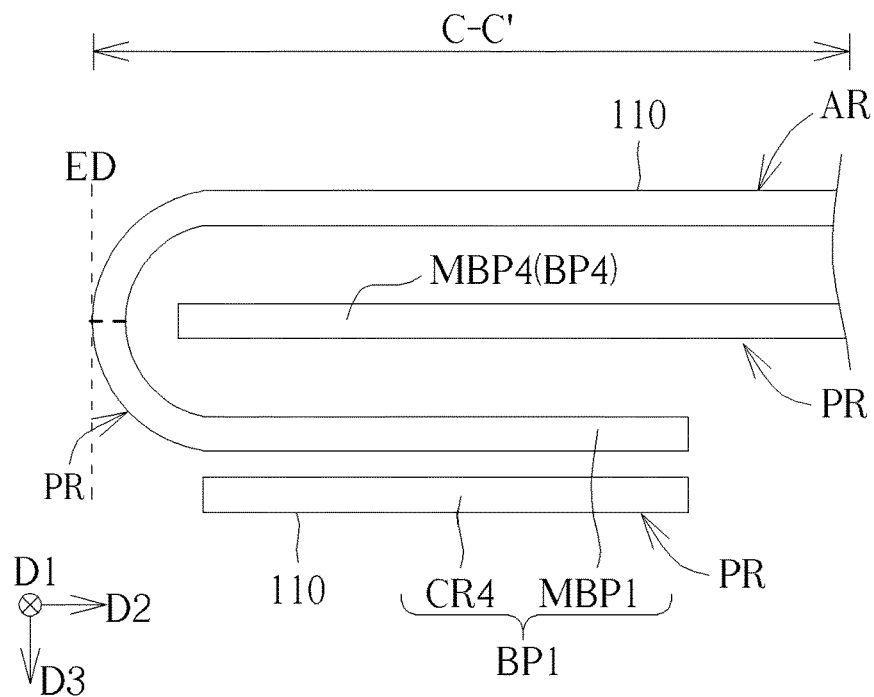
FIG. 6B is a schematic diagram showing a cross-sectional view taken along a cross-sectional line C-C' in FIG. 4C.

Referring to FIG. 4A, FIG. 4B, FIG. 4C, FIG. 5, FIG. 6A and FIG. 6B together with referring to FIG. 1, FIG. 4A, FIG. 4B and FIG. 4C are schematic diagrams respectively showing top views of a bending process of the electronic device according to the first embodiment of the present invention, FIG. 5 is a schematic diagram showing a cross-sectional view taken along a cross-sectional line A-A' in FIG. 4C, FIG. 6A is a schematic diagram showing a cross-sectional view taken along a cross-sectional line B-B' in FIG. 4C, and FIG. 6B is a schematic diagram showing a cross-sectional view taken along a cross-sectional line C-C' in FIG. 4C, wherein FIG. 4A to FIG. 4C show the electronic device 100 shown in FIG. 1 bent at different stages in the bending process, and FIG. 4C also shows the electronic device 100 of the first embodiment in a completed bending status. In the bending process of the electronic device 100 of this embodiment, the second bending part BP2 and the fourth bending part BP4 are bent towards the active region AR and are bent backward to the back of the active region AR of the flexible substrate 110 (as shown in FIG. 4A); next, the first bending part BP1 and the third bending part BP3 are bent towards the active region AR and are bent backward to the back of the active region AR of the flexible substrate 110 (as shown in FIG. 4B); and finally, the first corner portion CR1, the second corner portion CR2, the third corner portion CR3 and the fourth corner portion CR4 are bent backward to the back of the active region AR of the flexible substrate 110 (as shown in FIG. 4C), so as to complete the bending process of the electronic device 100, but the bending sequence of the present invention is not limited thereto. The bending process may be adjusted according to the design of the cutting structures and the bending requirements. In this embodiment, the first bending part BP1 is bent towards backside of the active region AR according to the first extending line EL1 parallel to the first direction D1 (i.e. bending direction B1 of FIG. 1), the second bending part BP2 is bent towards backside of the active region AR according to the second extending line EL2 parallel to the second direction D2 (the bending direction B2 of FIG. 1), the third bending part BP3 is bent towards backside of the active region AR according to the third extending line EL3 parallel to the first direction D1 (the bending direction B3 of FIG. 1), and the fourth bending part BP4 is bent towards backside of the active region AR according to the fourth extending line EL4 parallel to the second direction D2 (the bending direction B4 of FIG. 1). The first corner portion CR1 and the second corner portion CR2 are bent towards backside of the active region AR according to the second extending line EL2 parallel to the second direction D2, and the third corner portion CR3 and the fourth corner portion CR4 are bent towards backside of the active region AR according to the fourth extending line EL4 parallel to the second direction D2.

As shown in FIG. 4C, FIG. 5, FIG. 6A and FIG. 6B, after completing the bending process of the electronic device 100, the first corner portion CR1 may overlap the first main bending portion MBP1 and the second main bending portion MBP2 in the top view direction D3, the second corner portion CR2 may overlap the second main bending portion MBP2 and the third main bending portion MBP3 in the top view direction D3, the third corner portion CR3 may overlap the third main bending portion MBP3 and the fourth main bending portion MBP4 in the top view direction D3, and the fourth corner portion CR4 may overlap the first main bending portion MBP1 and the fourth main bending portion MBP4 in the top view direction D3. In FIG. 4C, FIG. 6A and FIG. 6B, according to the aforementioned bending sequence, at the upper-left corner of the flexible substrate 110 of the bent electronic device 100, the active region AR, the fourth main bending portion MBP4, the first main bending portion MBP1 and the fourth corner portion CR4 are arranged in sequence from upper to lower (i.e. along the top view direction D3), but not limited thereto. This sequence (from upper to lower) may be changed based on the bending sequence of the electronic device 100. For instance, in another embodiment, if the first bending part BP1 and the third bending part BP3 are bent firstly, and then the second bending part BP2, the first corner portion CR1, the second corner portion CR2, the fourth bending part BP4, the third corner portion CR3 and the fourth corner portion CR4 are bent, at the upper-left corner of the flexible substrate 110 of the bent electronic device 100, the active region AR, the first main bending portion MBP1, the fourth corner portion CR4 and the fourth main bending portion MBP4 are arranged in sequence from upper to lower (i.e. along the top view direction D3). Furthermore, in the top view direction D3, a distance between two of the portions of the flexible substrate 110 is just one kind of example in FIG. 5, FIG. 6A and FIG. 6B. In another embodiment, two of the portions of the flexible substrate 110 may contact with each other. According to the above-mentioned, the first main bending portion MBP1, the second main bending portion MBP2, the third main bending portion MBP3 and the fourth main bending portion MBP4 may be bent backward to the back of the active region AR of the flexible substrate 110 by bending one time, and each of the main bending portions MBP1-MBP4 has a different bending direction with respect to the active region AR. The first corner portion CR1, the second corner portion CR2, the third corner portion CR3 and the fourth corner portion CR4 may be bent backward to the back of the active region AR of the flexible substrate 110 by bending two times. Accordingly, in the aforementioned bending process, the peripheral region PR is bent backward to the back of the active region AR, so as to reduce the border of the electronic device 100 and downsize the electronic device 100. Note that the border represents a region between the active region AR and outer margins (the outer margin lines ED shown in FIG. 4C, FIG. 5, FIG. 6A and FIG. 6B) of the electronic device 100 after bending the electronic device 100.

In the conventional bending techniques, if the cutting structure does not exist in the peripheral region PR of the flexible substrate 110, when the bending process is performed on the peripheral region PR, some regions having the traces or the electronic components 122 may be bent at least two times. Thus, the traces and the electronic components 122 may be damaged or broken after the traces and the electronic components 122 are bent at least two times (e.g. a stress applied on the traces or the electronic components 122 is greater due to multiple bends, so as to make them be damaged or broken), such that the yield of the electronic device is influenced. In addition, if the cutting structure does not exist, the position of the region bent at least two times cannot be anticipated, such that it is hard to design the traces to avoid the region bent at least two times. In the present invention, since the flexible substrate 110 has the cutting structures in the peripheral region PR for determining the extending lines and dividing the peripheral region PR into different bending parts, each of the bending parts in the peripheral region PR may be bent according to the extending lines when bending the peripheral region PR, such that the main bending portions having the peripheral trace 128 and/or the electronic components 122 are only bent merely one time, so as to enhance the yield of the peripheral traces 128 and improve qualities of the electronic device 100.

Moreover, in this embodiment, because the first extending line EL1, the third extending line EL3 and the fourth extending line EL4 are respectively aligned with the first edge S1, the third edge S3 and the fourth edge S4 of the active region AR, such that the first main bending portion MBP1 of the first bending part BP1, the third main bending portion MBP3 of the third bending part BP3 and the fourth main bending portion MBP4 of the fourth bending part BP4 are directly adjacent to the active region AR. Thus, after the first bending part BP1, the third bending part BP3 and the fourth bending part BP4 are bent backward to the back of the active region AR of the flexible substrate 110, the first side region PS1, the third side region PS3 and the fourth side region PS4 are totally bent backward to the back of the active region AR. On the other hand, because a distance exists between the second extending line EL2 and the second edge S2 (i.e. a distance exists between the second main bending portion MBP2 of the second bending part BP2 and the active region AR), after the second main bending portion MBP2 is bent backward to the back of the active region AR, a portion of the second side region PS2 would not be bent backward to the back of the active region AR, and this portion may be the border SE (the border SE represents a region between the active region AR and the lower outer margin line ED after the electronic device 100 is bent), but not limited thereto. In other words, in this embodiment, three of the outer margin lines ED may be respectively aligned with the first edge S1, the third edge S3 and the fourth edge S4 of the active region AR, and a distance may exist between the other one of the outer margin lines ED and the second edge S2 of the active region AR, but not limited thereto. In another embodiment, a portion of the first side region PS1, a portion of the third side region PS3 and a portion of the fourth side region PS4 may not be bent backward to the back of the active region AR.

In particular, in this embodiment, referring to FIG. 4C, the left side of the first edge S1, the right side of the third edge S3 and the upper side of the fourth edge S4 may not have a border (or may have a very small border), and the lower side of the active region AR (the lower side of the second edge S2) may have a narrow border SE. Moreover, since a portion of the peripheral region PR on the lower side of the active region AR of this embodiment (i.e. a portion of the second side region PS2 of the peripheral region PR) is not bent, and the dense peripheral traces 128 are normally disposed on this portion to be electrically connected to the driving components 124, 126 or the electronic components 122, the intensive peripheral traces 128 may not be bent, so as to decrease the damage probability of the peripheral traces 128. Note that if the intensive peripheral traces 128 need to be bent, the peripheral traces 128 may be formed of a bendable material, such as nanometer silver, but not limited thereto.

After bending the electronic device 100, a radius of curvature of the bending part may range from 0.1 mm to 10 mm, from 0.2 mm to 5 mm or from 0.5 mm to 5 mm, but not limited thereto. Furthermore, since the second bending part BP2 and the fourth bending part BP4 of this embodiment are bent firstly, after bending the electronic device 100, the radius of curvature of the second bending part BP2 and the radius of curvature of the fourth bending part BP4 may be smaller than the radius of curvature of the first bending part BP1 and the radius of curvature of the third bending part BP3 (referring to FIG. 6A and FIG. 6B), but not limited thereto.

Moreover, because the shape of the active region AR of this embodiment is a rectangle having round corners, the electronic device 100 has the border in the peripheral region PR adjacent to the round corner of the active region AR, but not limited thereto. In another embodiment, the portion of the peripheral region PR adjacent to the round corner of the active region AR may be bent backward to the back of the active region AR. In this case, if the peripheral traces 128 are disposed on the portion of the peripheral region PR adjacent to the round corner of the active region AR, and this portion needs to be bent backward to the back of the active region AR, the peripheral traces 128 may be formed of the bendable material.

The electronic device of the present invention is not limited to the above embodiments. Further embodiments of the present invention are described below. For ease of comparison, same components will be labeled with the same symbol in the following. The following descriptions relate the differences between each of the embodiments, and repeated parts will not be redundantly described.

Figure 7:
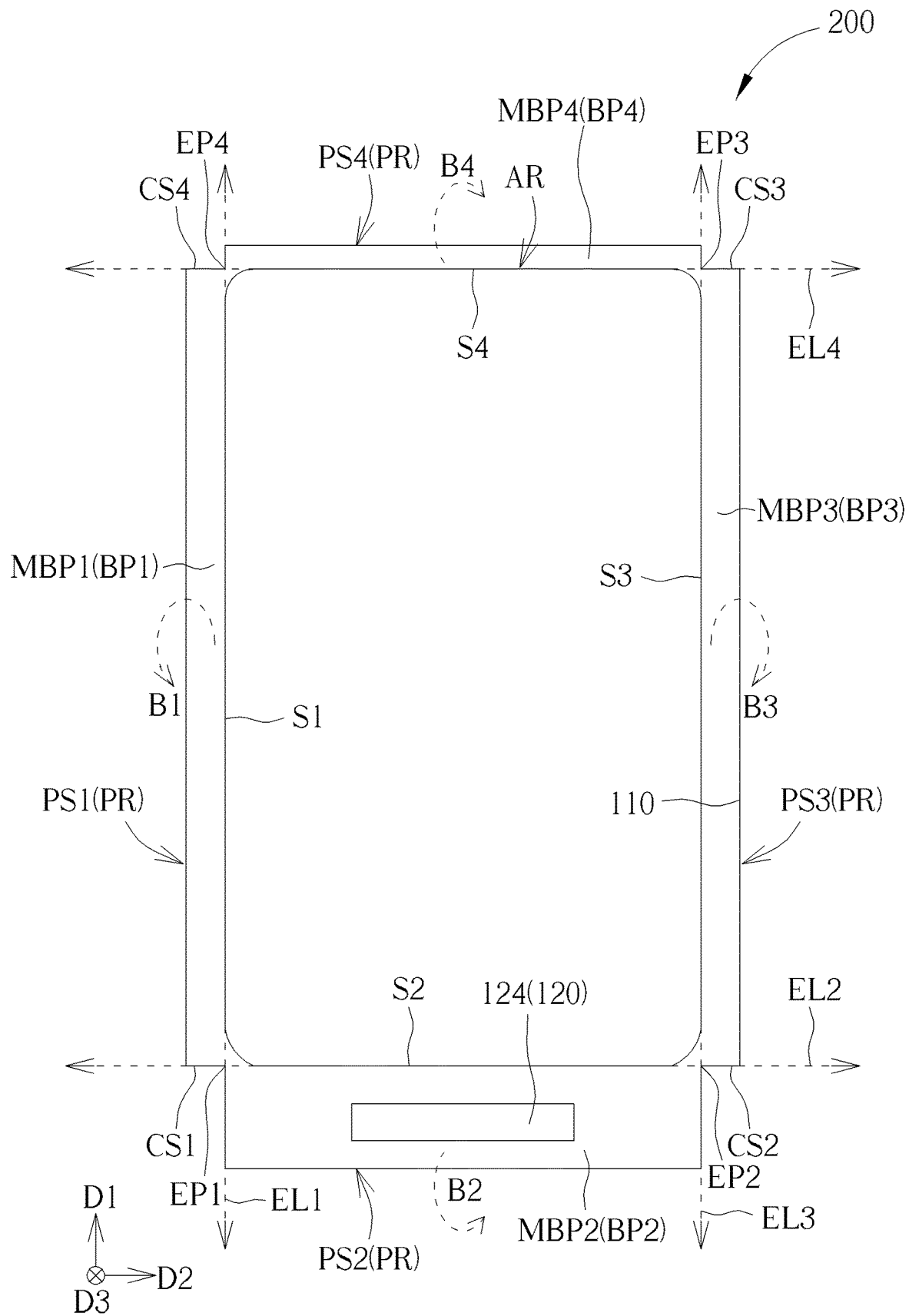
FIG. 7 is a schematic diagram showing a top view of an electronic device which is not bent according to a second embodiment of the present invention.
Figure 8:
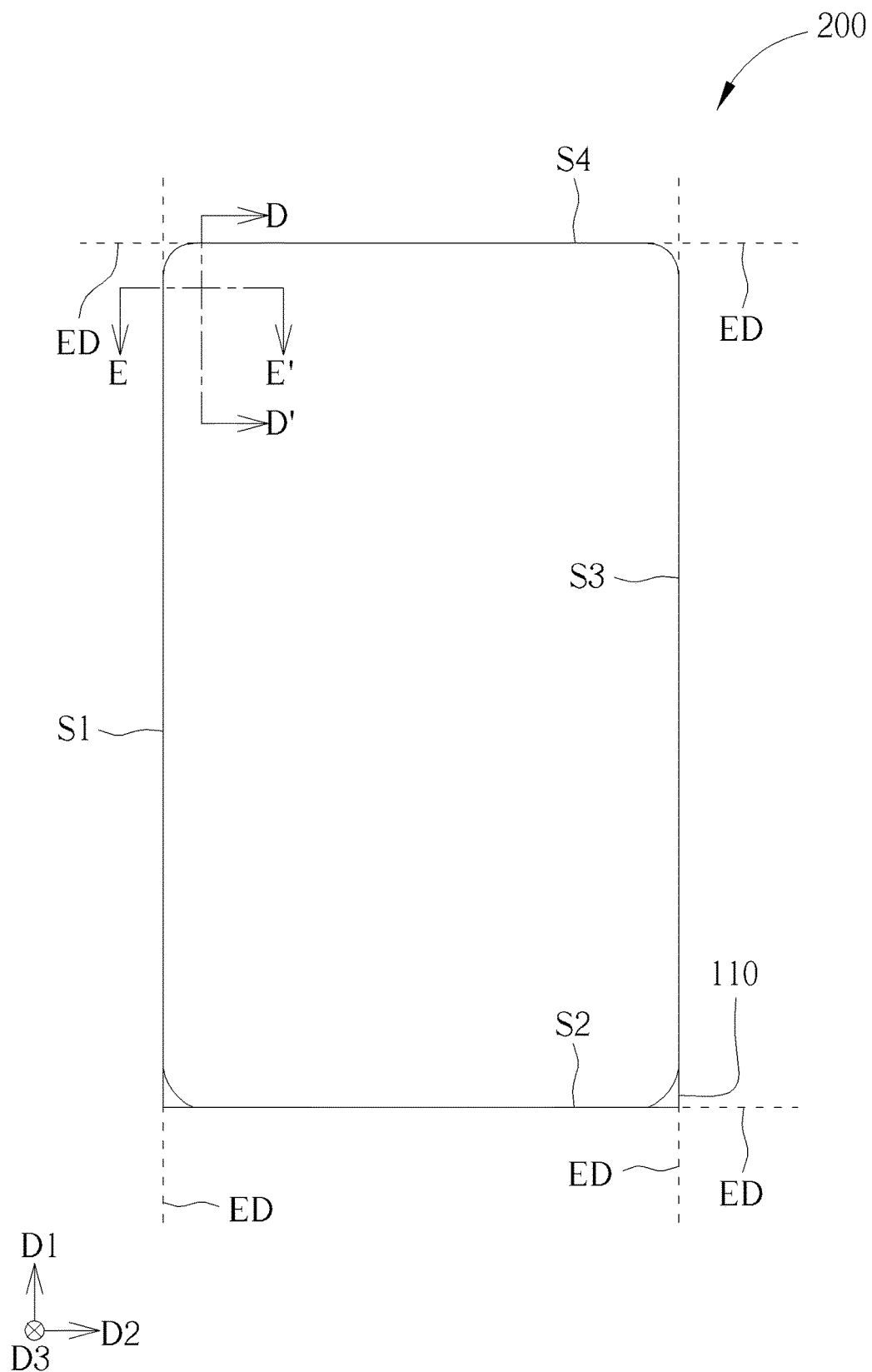
FIG. 8 is a schematic diagram showing a top view of the bent electronic device according to the second embodiment of the present invention.
Figure 9A:
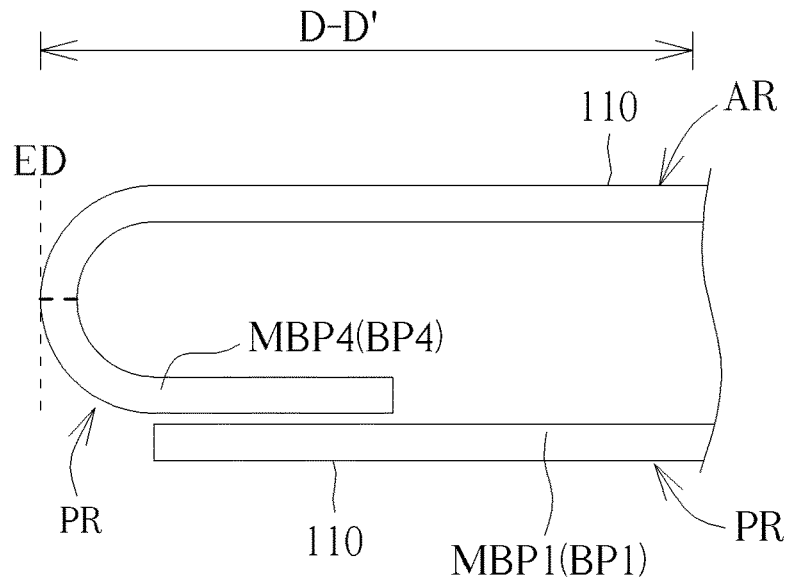
FIG. 9A is a schematic diagram showing a cross-sectional view taken along a cross-sectional line D-D' in FIG. 8.
Figure 9A:
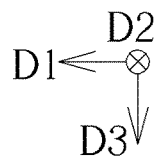
Figure 9B:
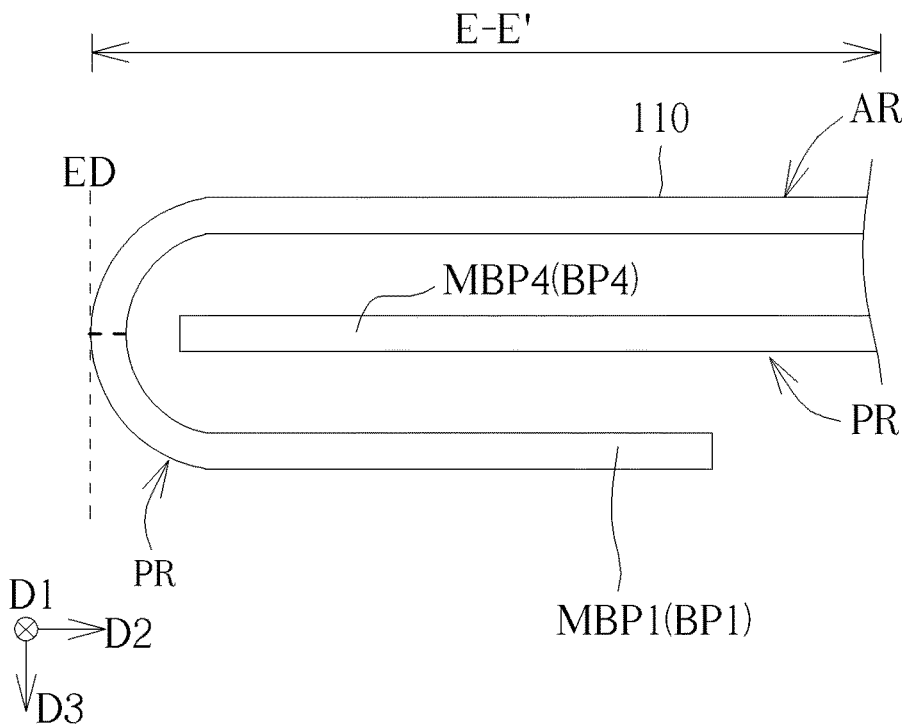
FIG. 9B is a schematic diagram showing a cross-sectional view taken along a cross-sectional line E-E' in FIG. 8.

Referring to FIG. 7, FIG. 8, FIG. 9A and FIG. 9B, FIG. 7 is a schematic diagram showing a top view of an electronic device which is not bent according to a second embodiment of the present invention, FIG. 8 is a schematic diagram showing a top view of the bent electronic device according to the second embodiment of the present invention, FIG. 9A is a schematic diagram showing a cross-sectional view taken along a cross-sectional line D-D' in FIG. 8, and FIG. 9B is a schematic diagram showing a cross-sectional view taken along a cross-sectional line E-E' in FIG. 8. As shown in FIG. 7, FIG. 8, FIG. 9A and FIG. 9B, the difference between this embodiment and the first embodiment is that each of the cutting structures of the electronic device 200 of this embodiment is rectangle, and each of the bending parts only has the main bending portion and does not have the corner portion. That is to say, when the flexible substrate 110 is not bent, in the second direction D2, the first bending part BP1 and the second bending part BP2 are staggered, the first bending part BP1 and the fourth bending part BP4 are staggered, the third bending part BP3 and the second bending part BP2 are staggered, and the third bending part BP3 and the fourth bending part BP4 are staggered. Thus, after bending the bending parts of this embodiment, no portion of the flexible substrate 110 is bent two times or more. Similarly, as shown in FIG. 7, FIG. 8, FIG. 9A and FIG. 9B, In the bending process of the electronic device 200 of this embodiment, for instance, the second bending part BP2 and the fourth bending part BP4 are bent firstly, and then the first bending part BP1 and the third bending part BP3 are bent, such that the first bending part BP1 and the third bending part BP3 are situated behind the second bending part BP2 and the fourth bending part BP4, but not limited thereto. Moreover, another difference between this embodiment and the first embodiment is that the first endpoint EP1 of the first cutting structure CS1 and the second endpoint EP2 of the second cutting structure CS2 are aligned with the second edge S2 of the active region AR in the second direction D2. That is to say, the second extending line EL2 is aligned with the second edge S2. Therefore, after the second main bending portion MBP2 is bent backward to the back of the active region AR, the second side region PS2 of the peripheral region PR may be totally bent backward to the back of the active region AR (as shown in FIG. 7). As the result, the left side of the first edge S1, the lower side of the second edge S2, the right side of the third edge S3 and the upper side of the fourth edge S4 shown in FIG. 8 may not have a border (or may have a very small border).

Figure 10:
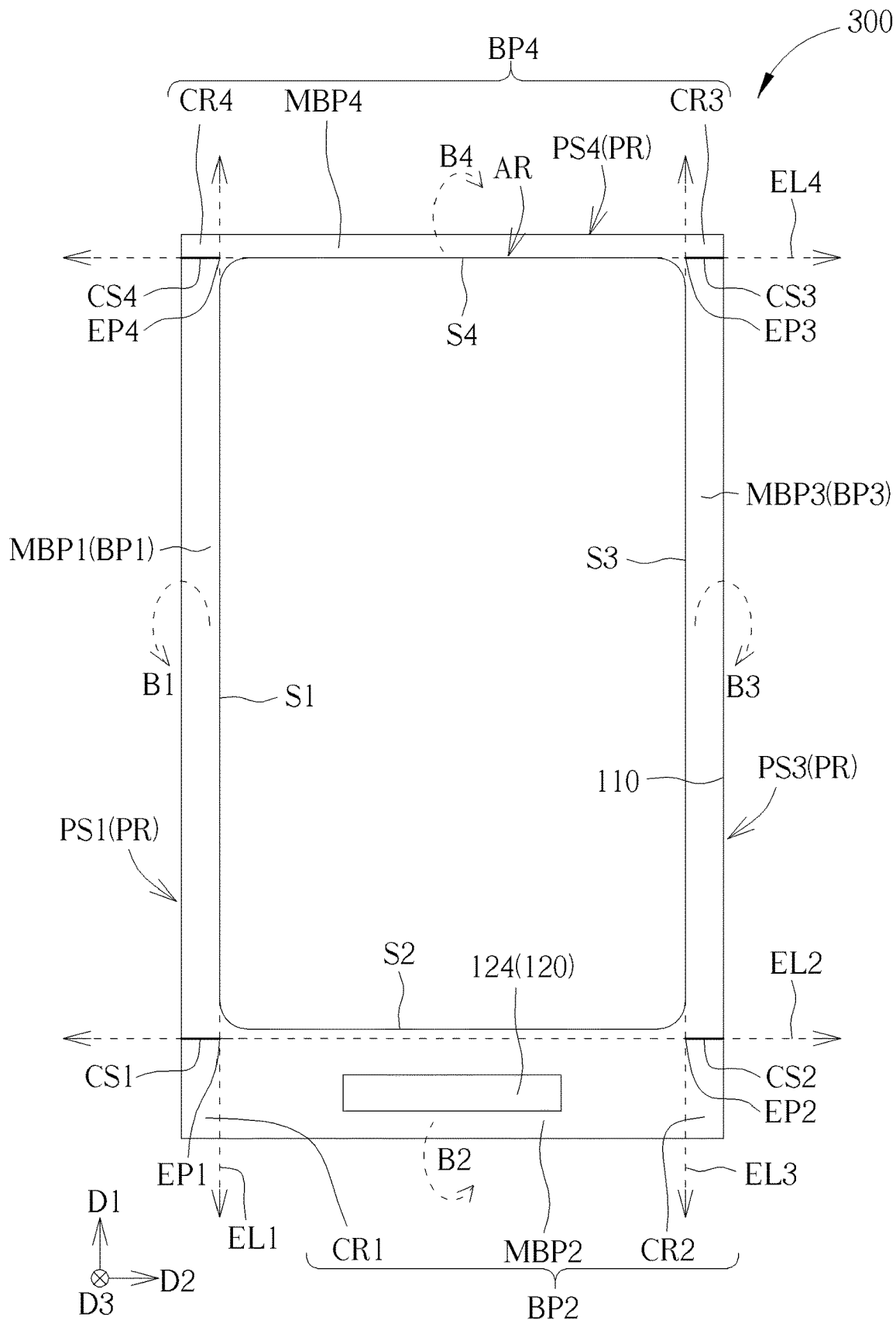
FIG. 10 is a schematic diagram showing a top view of an electronic device which is not bent according to a third embodiment of the present invention.

Referring to FIG. 10, FIG. 10 is a schematic diagram showing a top view of an electronic device which is not bent according to a third embodiment of the present invention. As shown in FIG. 10, the difference between this embodiment and the first embodiment is that each of the cutting structures of the electronic device 300 is a straight cutting line, and each of the cutting lines is cut from edges of the flexible substrate 110 which are parallel to the first direction D1. Thus, the first bending part BP1 may include the first main bending portion MBP1, the second bending part BP2 may include the second main bending portion MBP2, the first corner portion CR1 and the second corner portion CR2, the third bending part BP3 may include the third main bending portion MBP3, and the fourth bending part BP4 may include the fourth main bending portion MBP4, the third corner portion CR3 and the fourth corner portion CR4. In the bending process of the electronic device 300 of this embodiment, the first bending part BP1 is bent towards the backside of active region AR according to the first extending line EL1, the second bending part BP2 is bent towards the backside of active region AR according to the second extending line EL2, the third bending part BP3 is bent towards the backside of active region AR according to the third extending line EL3, the fourth bending part BP4 is bent towards the backside of active region AR according to the fourth extending line EL4, the first corner portion CR1 and the fourth corner portion CR4 are bent towards the backside of active region AR according to the first extending line EL1, and the second corner portion CR2 and the third corner portion CR3 are bent towards the backside of active region AR according to the third extending line EL3, but the bending sequence is not limited thereto.

Figure 11:
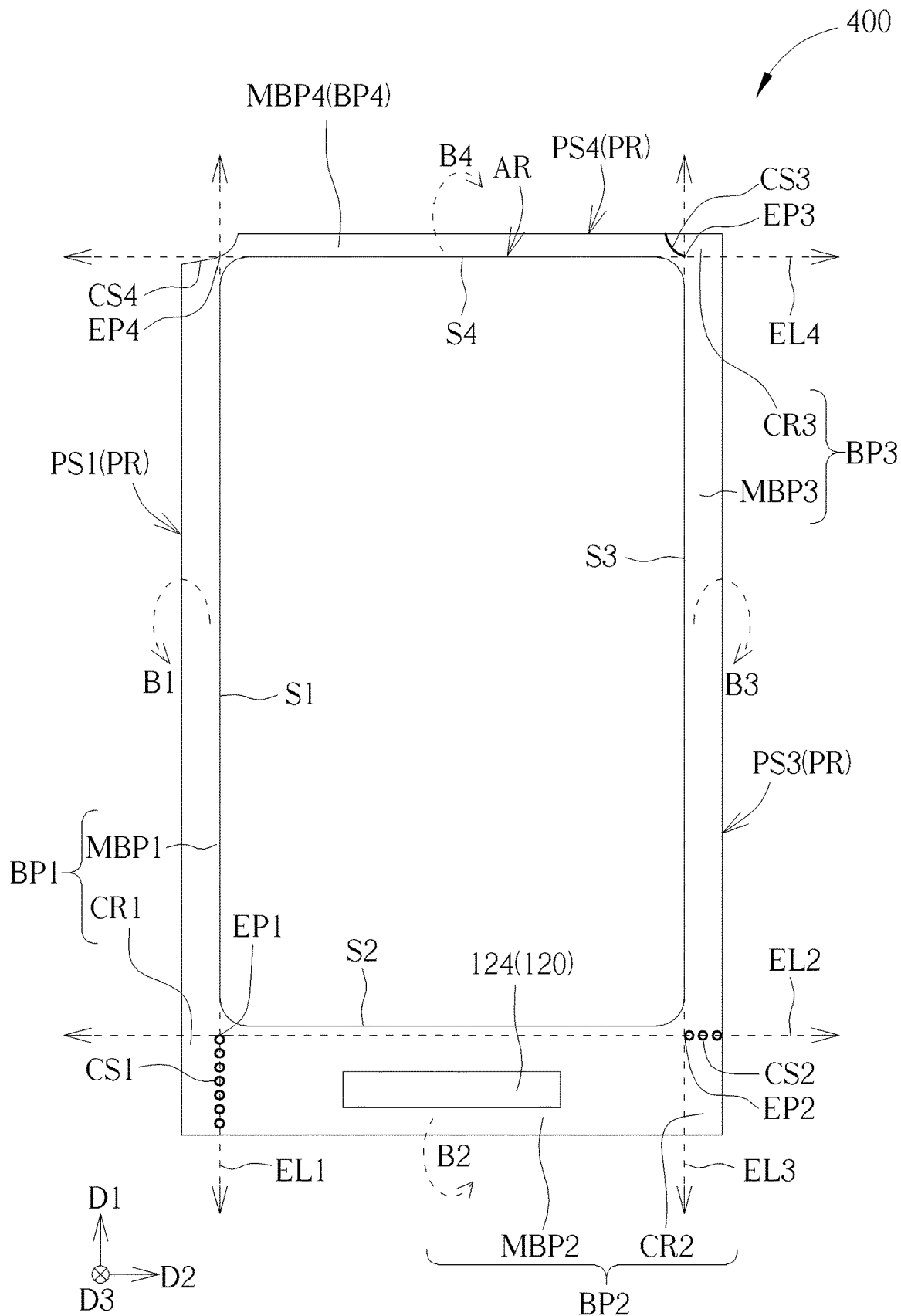
FIG. 11 is a schematic diagram showing a top view of an electronic device which is not bent according to a fourth embodiment of the present invention.

Referring to FIG. 11, FIG. 11 is a schematic diagram showing a top view of an electronic device which is not bent according to a fourth embodiment of the present invention. As shown in FIG. 11, the difference between this embodiment and the first embodiment is that the cutting structures of the electronic device 400 of this embodiment have different types. In this embodiment, the third cutting structure CS3 may be a curved cutting line, the fourth cutting structure CS4 may be a sector (e.g. the upper-left corner of the electronic device 400 is cut off), and the first cutting structure CS1 and the second cutting structure CS2 may be formed by cutting a plurality of holes, wherein the holes may be arranged linearly, but not limited thereto. The holes may be arranged in any other type, and each of the cutting structures may be adjusted to any other type or changed the top view shape. Regarding the first cutting structure CS1 and the second cutting structure CS2 of this embodiment, the plurality of holes may be formed firstly, and then, the cutting structures CS1-CS2 may be formed by cutting the holes with a tool. Because of the design of the fourth cutting structure CS4, the electronic device 400 may not have the fourth corner portion CR4, and the fourth endpoint EP4 of this embodiment is situated at the intersection of the first extending line EL1 and the fourth extending line EL4. Furthermore, in this embodiment, the first cutting structure CS1 and the third cutting structure CS3 are cut from edges of the flexible substrate 110 which are parallel to the second direction D2, and the second cutting structure CS2 is cut along the second direction D2 from an edge of the flexible substrate 110 parallel to the first direction D1. Therefore, the first bending part BP1 may include the first main bending portion MBP1 and the first corner portion CR1, the second bending part BP2 may include the second main bending portion MBP2 and the second corner portion CR2, the third bending part BP3 may include the third main bending portion MBP3 and the third corner portion CR3, and the fourth bending part BP4 may only include the fourth main bending portion MBP4. In the bending process of the electronic device 400 of this embodiment, the first bending part BP1 is bent towards the backside of active region AR according to the first extending line EL1, the second bending part BP2 is bent towards the backside of active region AR according to the second extending line EL2, the third bending part BP3 is bent towards the backside of active region AR according to the third extending line EL3, the fourth bending part BP4 is bent towards the backside of active region AR according to the fourth extending line EL4, the first corner portion CR1 is bent towards the backside of active region AR according to the second extending line EL2, the second corner portion CR2 is bent towards the backside of active region AR according to the third extending line EL3, and the third corner portion CR3 is bent towards the backside of active region AR according to the fourth extending line EL4, but the bending sequence is not limited thereto.

In summary, the peripheral region of the present invention is bent backward to the back of the active region by the bending process to reduce the border and downsize the electronic device. Furthermore, because the flexible substrate has the cutting structures in the peripheral region to determine the extending lines and separate the bending parts, when performing the bending process on the peripheral region, each of the bending parts of the peripheral region may be bent backward according to the corresponding extending line, such that the main bending portions having the peripheral traces and/or the electronic components are only bent one time, so as to enhance the yield of the peripheral traces and the yield of the electronic device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device having a display region and a peripheral region situated outside of the display region, the electronic device comprising:
    a flexible substrate comprising:
        a first side region disposed in the peripheral region, wherein the display region and the first side region are separated by a first edge of the display region, the first edge is parallel to a first direction, and a length direction of the first side region is parallel to the first direction;
        a second side region disposed in the peripheral region, wherein the display region and the second side region are separated by a second edge of the display region, and the second edge is parallel to a second direction, a length direction of the second side region is parallel to the second direction, and the second direction is perpendicular to the first direction;
        a first bending part comprised in the first side region in the peripheral region, wherein the first bending part is configured to be bent;
        a second bending part comprised in the second side region in the peripheral region, wherein the second bending part is configured to be bent;
        a first cutting structure disposed in the peripheral region, wherein the first cutting structure has a first endpoint, the first cutting structure comprises two edges separated by the first endpoint, one of the two edges of the first cutting structure belongs to the first bending part, and another one of the two edges of the first cutting structure belongs to the second bending part; and
        a second cutting structure disposed in the peripheral region, wherein the second cutting structure has a second endpoint, and the second cutting structure is corresponding to the first cutting structure in the first direction; and
    a driving component disposed on the flexible substrate and disposed in the peripheral region;
    wherein the driving component overlaps the flexible substrate in a top view direction when the flexible substrate is not bent, and the top view direction is perpendicular to the first direction and the second direction;
    wherein a first extending line parallel to the first direction passes through the first endpoint of the first cutting structure and the second endpoint of the second cutting structure, and a greatest length of the first cutting structure along the first extending line is longer than a greatest length of the second cutting structure along the first extending line in a horizontal direction.

2. The electronic device of claim 1, wherein the flexible substrate has a first exposing surface and a second exposing surface opposite to each other, the first exposing surface and the second exposing surface is opposite to each other in the top view direction when the flexible substrate is not bent, the first cutting structure is a penetrating structure, and the first cutting structure is directly connected between the first exposing surface and the second exposing surface.

3. The electronic device of claim 1, wherein the flexible substrate further comprising:
a third side region disposed in the peripheral region, wherein the display region and the third side region are separated by a third edge of the display region, the third edge is parallel to the second direction, and a length direction of the third side region is parallel to the second direction; and
a third bending part comprised in the third side region in the peripheral region, wherein the third bending part is configured to be bent;
wherein the second cutting structure comprises two edges separated by the second endpoint, one of the two edges of the second cutting structure belongs to the first bending part, and another one of the two edges of the second cutting structure belongs to the third bending part.

4. The electronic device of claim 3, wherein the flexible substrate further comprising:
a fourth side region disposed in the peripheral region, wherein the display region and the fourth side region are separated by a fourth edge of the display region, and the fourth edge is parallel to the first direction, a length direction of the fourth side region is parallel to the first direction;
a fourth bending part comprised in the fourth side region in the peripheral region,
wherein the fourth bending part is configured to be bent;
a third cutting structure disposed in the peripheral region, wherein the third cutting structure has a third endpoint, the third cutting structure comprises two edges separated by the third endpoint, one of the two edges of the third cutting structure belongs to the third bending part, and another one of the two edges of the third cutting structure belongs to the fourth bending part; and
a fourth cutting structure disposed in the peripheral region, wherein the fourth cutting structure has a fourth endpoint, the fourth cutting structure comprises two edges separated by the fourth endpoint, one of the two edges of the fourth cutting structure belongs to the fourth bending part, and another one of the two edges of the fourth cutting structure belongs to the second bending part.

5. The electronic device of claim 4, wherein the first cutting structure corresponds to the fourth cutting structure in the second direction.

6. The electronic device of claim 1, wherein the two edges of the first cutting structure are a portion of outer side edges of the flexible substrate.

7. The electronic device of claim 1, wherein the first bending part is bent according to the first extending line passing through the first endpoint and parallel to the first direction, and the second bending part is bent according a second extending line passing through the first endpoint and parallel to the second direction.

8. The electronic device of claim 7, wherein the first extending line is aligned with the first edge of the display region.

9. The electronic device of claim 7, wherein a distance exists between the second edge of the display region and the second extending line.

10. The electronic device of claim 1, wherein the first bending part comprises a corner portion, and the first cutting structure is situated between the corner portion and the second bending part when the flexible substrate is not bent.

11. The electronic device of claim 10, wherein when the first bending part and the second bending part are bent, the corner portion is bent, and the corner portion overlaps the second bending part and other portion of the first bending part in the top view direction.

12. The electronic device of claim 10, wherein the corner portion has a label or a mark.

13. The electronic device of claim 1, wherein the driving component is disposed on the second bending part.

14. The electronic device of claim 1, further comprising a peripheral trace disposed on the flexible substrate, wherein the driving component is electrically connected to the peripheral trace, a space exists between the first cutting structure and the display region in a top view, and the peripheral trace passes through the space in the top view, and the top view is a viewing result viewing along the top view direction.

15. The electronic device of claim 14, further comprising another driving component disposed on the flexible substrate and disposed in the peripheral region, wherein the peripheral trace is electrically connected between the driving component and the another driving component.

16. The electronic device of claim 15, wherein the driving component is disposed on the second bending part, and the another driving component is disposed on the first bending part.

17. The electronic device of claim 1, wherein a radius of curvature of the first bending part and a radius of curvature of the second bending part range from 0.1 mm to 10 mm when the first bending part and the second bending part are bent.

18. The electronic device of claim 1, further comprising a thin film transistor disposed on the flexible substrate and disposed in the display region, wherein the thin film transistor is electrically connected to a display component configured to display an image in the display region.

19. The electronic device of claim 1, further comprising a display component disposed on the flexible substrate and disposed in the display region, wherein the display component is configured to display an image in the display region.

20. An electronic device having a display region and a peripheral region situated outside of the display region, the electronic device comprising:
a flexible substrate comprising:
a first side region disposed in the peripheral region, wherein the display region and the first side region are separated by a first edge of the display region, the first edge is parallel to a first direction, and a length direction of the first side region is parallel to the first direction;
a second side region disposed in the peripheral region, wherein the display region and the second side region are separated by a second edge of the display region, and the second edge is parallel to a second direction, a length direction of the second side region is parallel to the second direction, and the second direction is perpendicular to the first direction;
a first cutting structure disposed in the peripheral region, wherein the first cutting structure has a first endpoint, the first cutting structure comprises two edges separated by the first endpoint, one of the two edges of the first cutting structure belongs to the first side region, and another one of the two edges of the first cutting structure belongs to the second side region; and a second cutting structure disposed in the peripheral region, wherein the second cutting structure has a second endpoint, and the second cutting structure is corresponding to the first cutting structure in the first direction; and a driving component disposed on the flexible substrate and disposed in the peripheral region;

wherein the driving component overlaps the flexible substrate in a top view direction when the flexible substrate is not bent, and the top view direction is perpendicular to the first direction and the second direction;

wherein a first extending line parallel to the first direction passes through the first endpoint of the first cutting structure and the second endpoint of the second cutting structure, and a greatest length of the first cutting structure along the first extending line is longer than a greatest length of the second cutting structure along the first extending line in a horizontal direction.

\* \* \* \* \*